United States Patent
Ausschnitt et al.

[11] Patent Number: 5,877,861
[45] Date of Patent: Mar. 2, 1999

[54] METHOD FOR OVERLAY CONTROL SYSTEM

[75] Inventors: Christopher P. Ausschnitt, Brookfield, Conn.; Timothy J. Wiltshire, Fishkill, N.Y.

[73] Assignee: International Business Machines Corporation, Armonk, N.Y.

[21] Appl. No.: 971,065

[22] Filed: Nov. 14, 1997

[51] Int. Cl.[6] .............................. G01B 11/00; G03F 9/00
[52] U.S. Cl. ............................. 356/401; 430/22; 430/30
[58] Field of Search ..................... 356/399–401, 356/375; 250/548, 559.3; 430/30, 22; 355/43, 53; 438/7, 10

[56] References Cited

U.S. PATENT DOCUMENTS 5,468,580  11/1995  Tanaka .
5,656,402   8/1997  Kasuga .
5,783,341   7/1998  Vzawa .

*Primary Examiner*—K. P. Hantis
*Attorney, Agent, or Firm*—Ratner & Prestia; Tiffany L. Townsend

[57] ABSTRACT

A method for overlay metrology and control. Simultaneous use of between-field overlay metrology to control field term alignment error at all levels and level-to-level metrology to control field term, grid term, and translation alignment errors at all levels is applied.

15 Claims, 14 Drawing Sheets

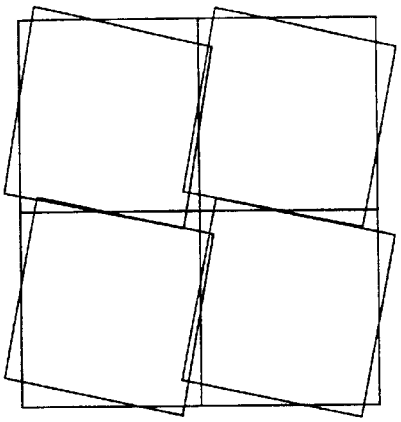
FIG. IA
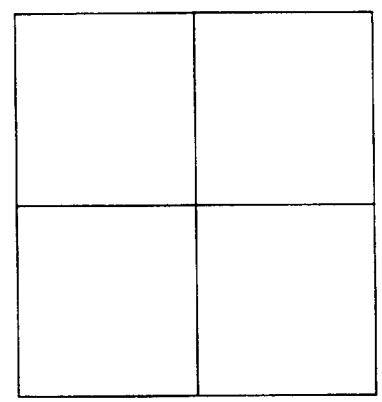
FIG. IB
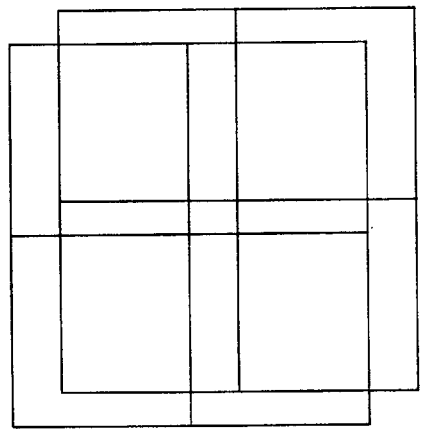
FIG. IC
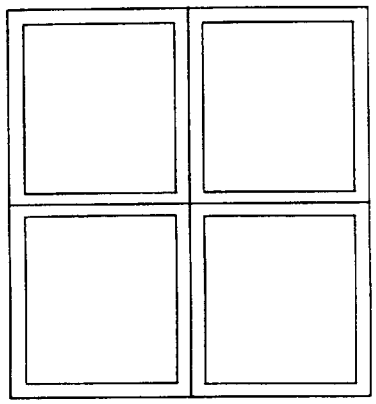
FIG. ID
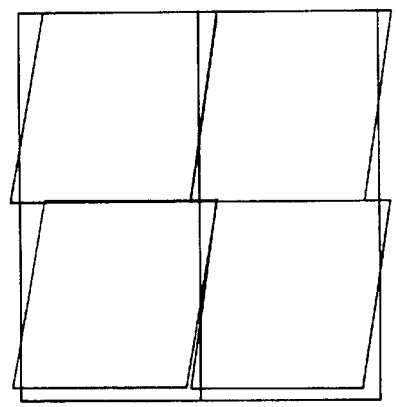
FIG. IE

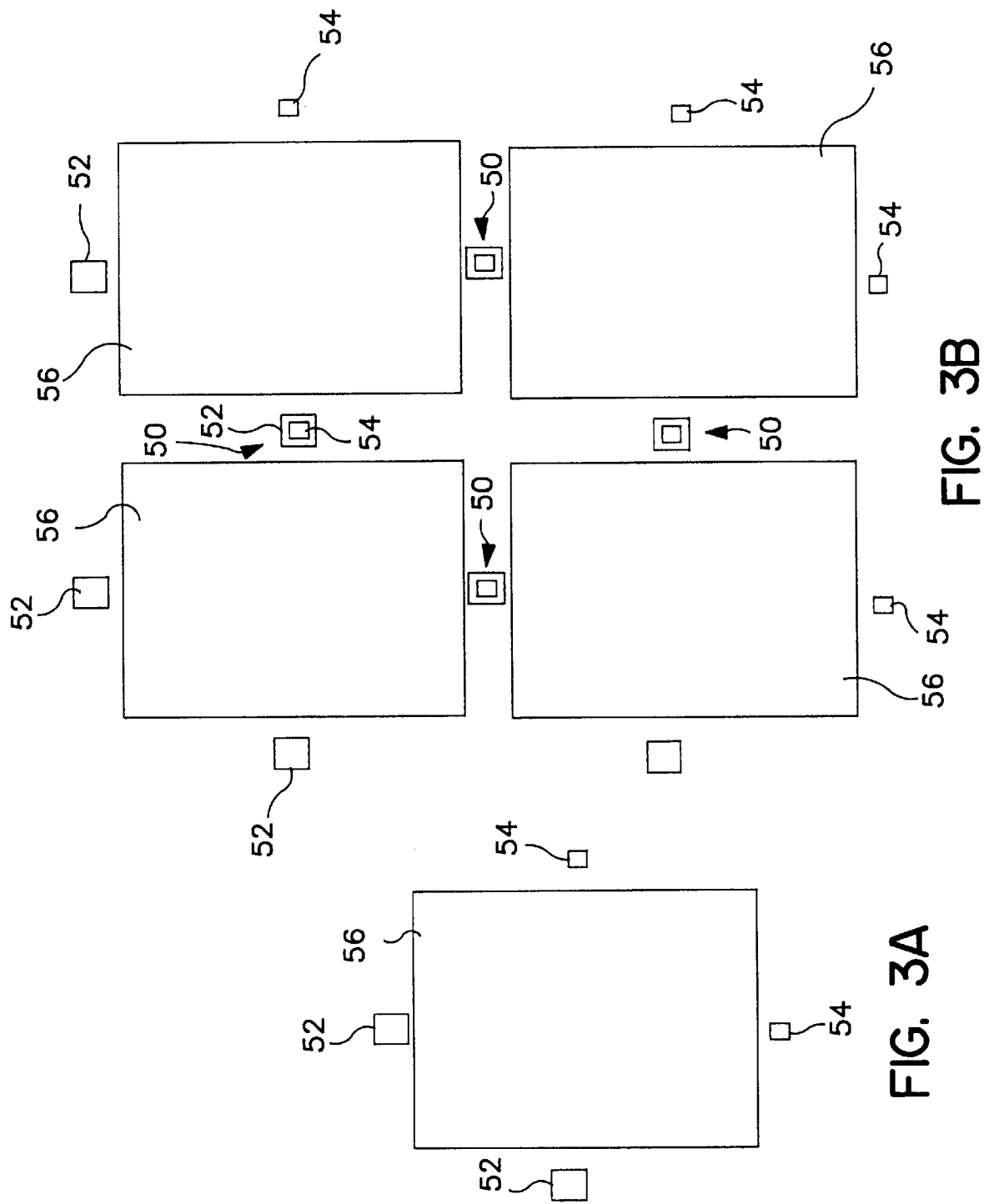

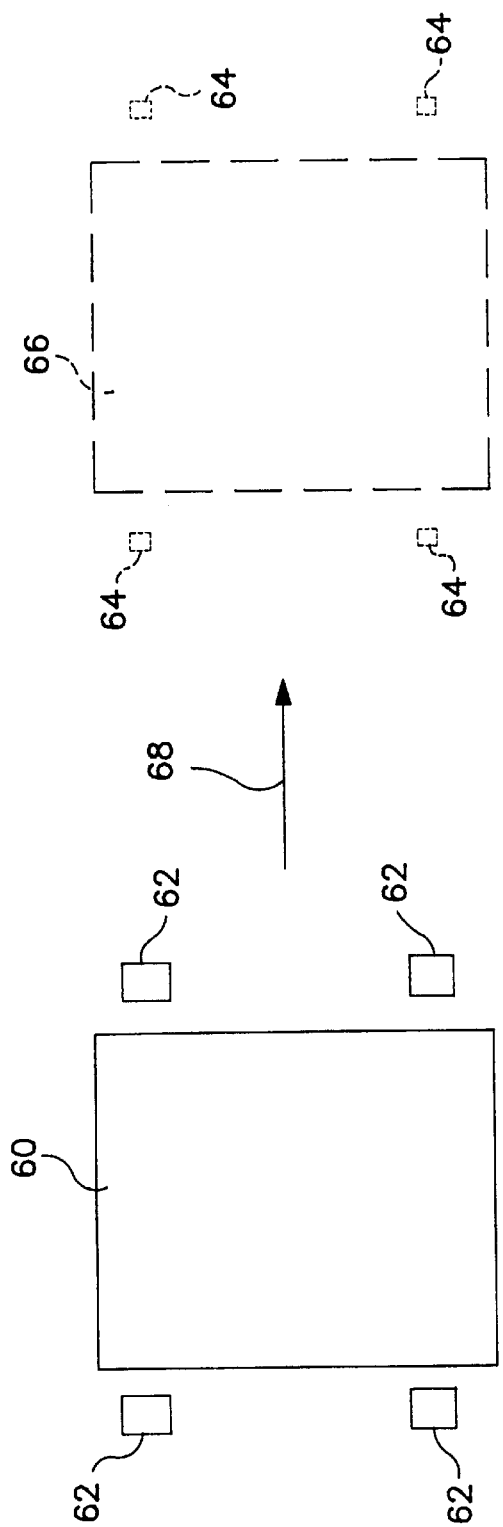
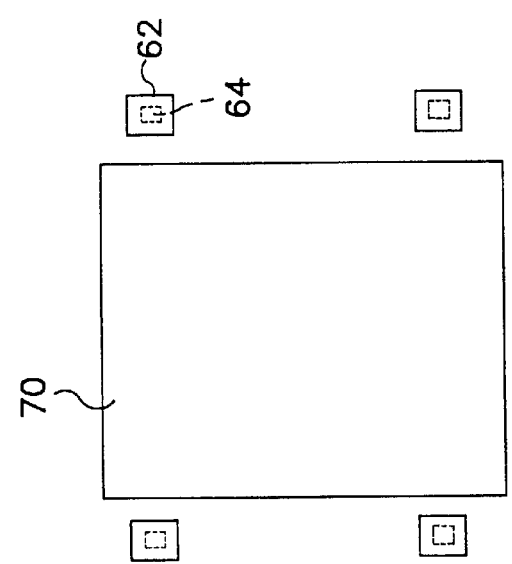

METHOD FOR OVERLAY CONTROL SYSTEM

TECHNICAL FIELD

The present invention relates generally to the manufacture of integrated circuits and, more specifically, to a method of optimizing correction of wafer stepper overlay errors. The invention particularly minimizes errors when semiconductor manufacturers use different field sizes at different levels.

BACKGROUND OF THE INVENTION

Semiconductor manufacturing involves the printing of multiple integrated circuit patterns on successive levels of exposure tools known as steppers. These steppers typically pattern different layers by applying step and repeat lithography exposure or step and scan lithography exposure in which the full area of a wafer is patterned by the sequential exposure of stepper fields containing one or more integrated circuits (also known as chips).

A requirement of the manufacturing process is to keep the alignment error, between levels, below acceptable product tolerances. FIGS. 1a, 1b, 1c, 1d, and 1e show qualitative examples of possible field alignment errors for four adjacent fields. Specifically, FIG. 1a shows field rotation about the center; FIG. 1b shows no field errors; FIG. 1c shows X,Y translation in which all of the fields on the substrate are shifted by the same amount in the X (horizontal) and Y (vertical) directions; FIG. 1d shows X,Y field magnification (i.e., the stepped fields are too small or too large); and FIG. 1e shows field skew. FIGS. 2a, 2b, and 2c show qualitative examples of possible field grid overlay errors which can result after applying the exposure systems. Specifically, FIG. 2a shows X,Y grid magnification (i.e., the fields are stepped too far apart between the "A" and the "B" levels); FIG. 2b shows grid rotation in which all of the patterns on the "B" level are rotated with respect to the patterns on the "A" level; and FIG. 2c shows grid skew.

A conventional method used to measure and control intra-field error is shown in FIGS. 3a and 3b. The "A" to "A" (or "B" to "B") type overlay errors are between-field errors that occur within a single level to itself. A single field 56 is shown in FIG. 3a having outer boxes 52 on the left and top side and inner boxes 54 on the bottom and right. Outer boxes 52 are larger than inner boxes 54. When multiple fields are stepped adjacent to one another, the two sets of boxes interlock with inner boxes 54 positioned in outer boxes 52 as shown in FIG. 3b. Metrology tools are used to measure the overlay error based on how far the inner box 54 is displaced from the center of the outer box 52. Metrology refers to measurement of the relative X and Y center displacement differences between the interlocking box-in-box structures 50 for the purposes of the drawing. Metrology can also be accomplished by other techniques; the present invention does not depend on the specific overlay measurement technique used.

Because inner boxes 54 are centered in outer boxes 52 as shown in FIG. 3b, no between-field error exists. FIG. 4 provides a qualitative example of field rotation error where the interlocking box-in-box structures 50 are displaced (i.e., inner boxes 54 are translated upward and to the right relative to outer boxes 52). FIG. 5 similarly provides a qualitative example of field Y magnification error where the interlocking box-in-box structures 50 are also displaced but in a different way.

A conventional method used to control level-to-level error is shown in FIGS. 6a, 6b, and 6c. The "B" to "A" type overlay errors occur between two overlying levels "A" and "B" FIG. 6a shows "B" level pattern 60 surrounded by outer boxes 62. FIG. 6b shows "A" level pattern 66 surrounded by inner boxes 64. Outer boxes 62 are larger than inner boxes 64. "B" level pattern 60 is placed over "A" level pattern 66 (as shown by the arrow 68) to yield the result 70 shown in FIG. 6c. As above, metrology tools are used to measure the overlay error based on how far the inner box 64 is displaced from the center of the outer box 62. Because inner boxes 64 are centered in outer boxes 62 as shown in FIG. 6c, no level-to-level error exists.

The typical process flow diagram used to correct and align an overlay system at the $N^{th}$ level, where two different photo tools are used, is shown in FIG. 7. U.S. Pat. No. 5,444,538 issued to Pelligrini teaches a system and method for optimizing the grid and level-to-level registration of wafer patterns. It is an example of "B" to "A" level control using two different photo tools. Pelligrini specifically addresses the equations and solutions for a two field on one field overlay system.

The conventional solution is insufficient to allow field size mixing between large field and small field applications due to the random walk accrual of incremental field error. A method of minimization of overlay error is needed for cross-boundary stepping applications in which the fields on successive levels straddle the boundaries between fields on each level.

SUMMARY OF THE INVENTION

To meet this and other needs, and in view of its purposes, the present invention provides a simple and effective method for optimization of stepper overlay error correction having an "A" level field stepper, a "B" level field stepper, metrology equipment, and a processor. The "A" level field layer is patterned on a substrate using the "A" level field stepper. Then the "B" level field layer is patterned overlaying the "A" level field layer using the "B" level field stepper. Next, the level-to-level field and within-level between-field errors are measured using overlay targets and metrology equipment. The field term alignment errors are calculated from the within-level between-field overlay measurement using the processor. The correction factors are calculated from the field term alignment errors and the level-to-level overlay measurements using the processor. The field layers are then aligned based on the correction factors.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 1a, 1b, 1c, 1d, and 1e show qualitative examples of field alignment errors;

FIGS. 3a and 3b show an example of a conventional method used to measure between-field errors (no errors exist);

FIG. 6a illustrates an example of a "B" level field pattern;

FIG. 6b illustrates an example of an "A" level field pattern;

FIG. 6c illustrates an example of a conventional method used to measure level-to-level errors (no errors exist);

DETAILED DESCRIPTION OF THE INVENTION

In order for integrated circuits to function properly, each chip must be correctly patterned at each level. Productivity optimization demands that the number of chips printed per field be maximized. Because of technical capability and other constraints, the field sizes and/or field shapes of the steppers used on different process levels may vary; hence, the maximum number and/or arrangement of chips within the fields may also vary from level to level. Current overlay control practices are such that the actual use of different field sizes at different process levels may not be possible because of "random walk" accumulation of alignment errors. This invention pertains to the minimization of such alignment errors between levels across the wafer.

Figure 2A:
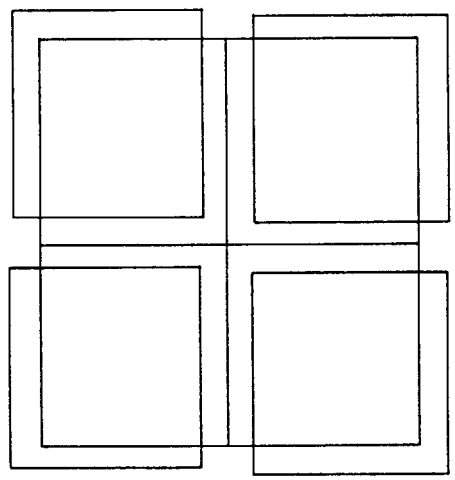
FIGS. 2a, 2b, and 2c show qualitative examples of grid overlay errors.
Figure 2B:
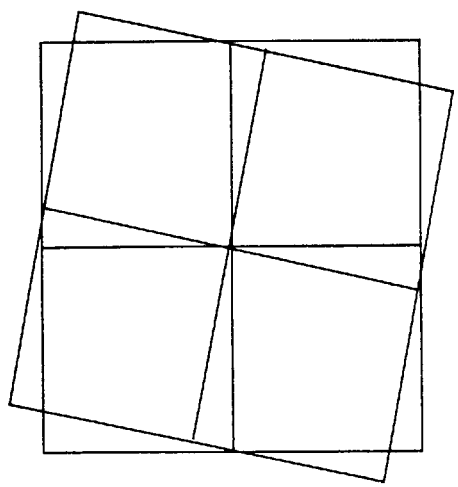
Figure 2C:
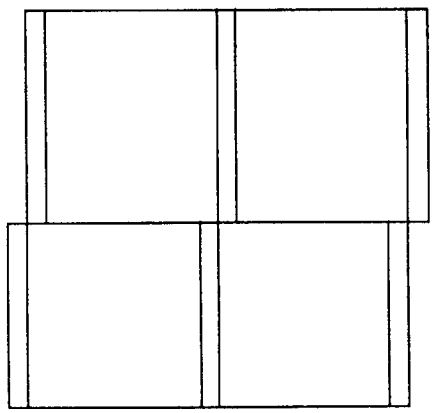
Figure 4:
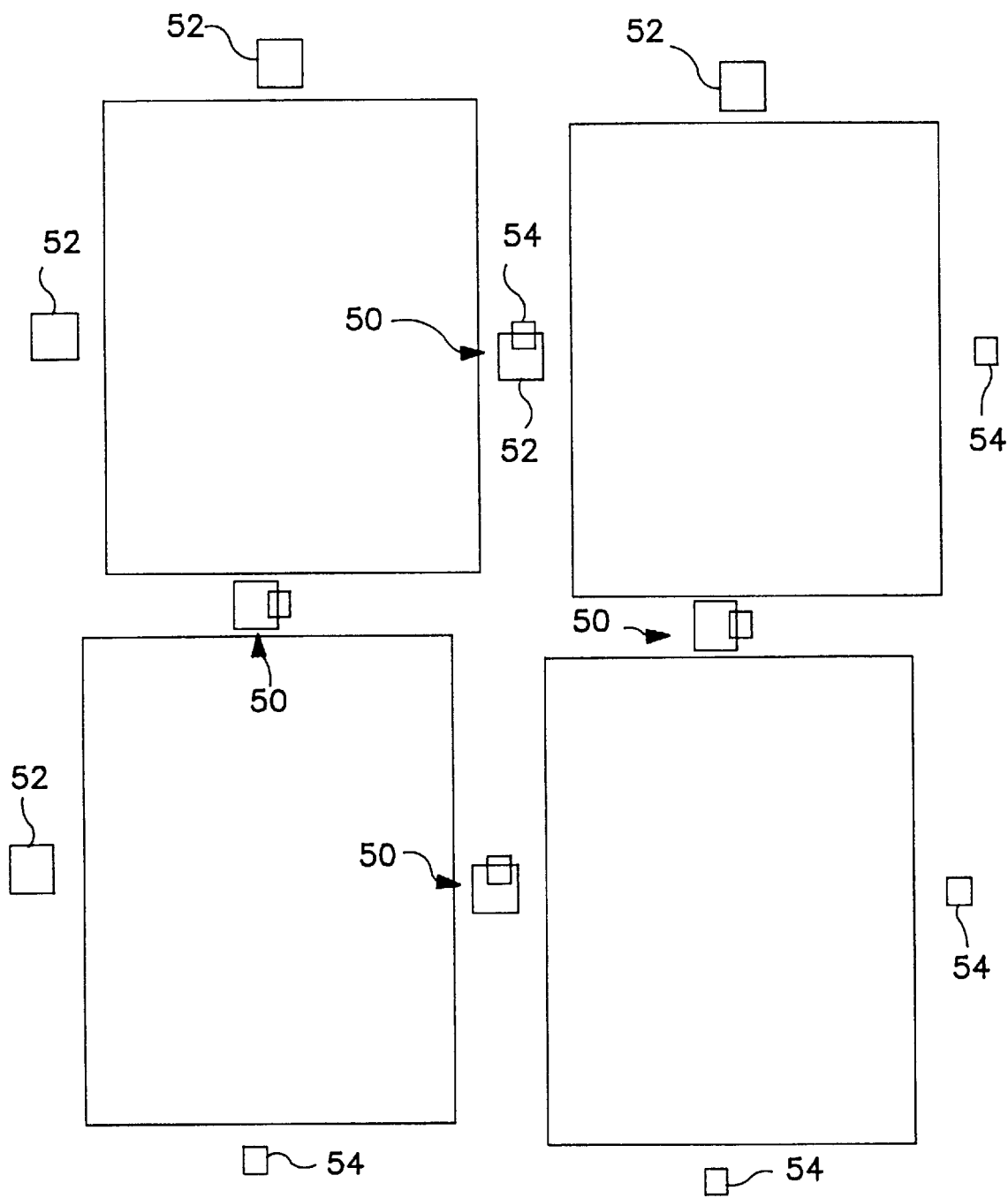
FIG. 4 is an example of the conventional method shown in FIGS. 3a and 3b when used to measure between-field errors when intra-field rotation error is present.
Figure 5:
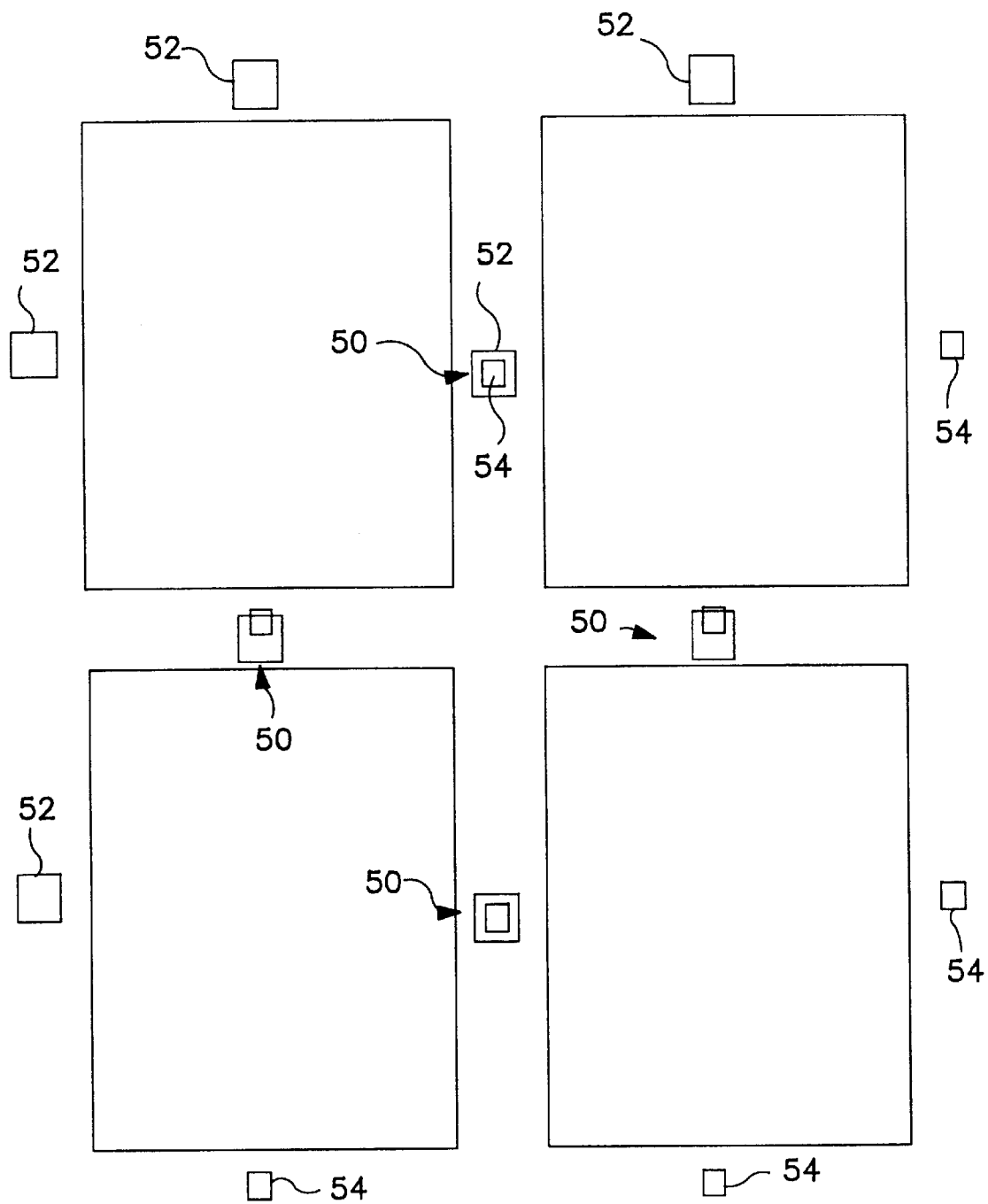
FIG. 5 is an example of the conventional method shown in FIGS. 3a and 3b when used to measure between-field errors when intra-field Y magnification error is present.
Figure 7:
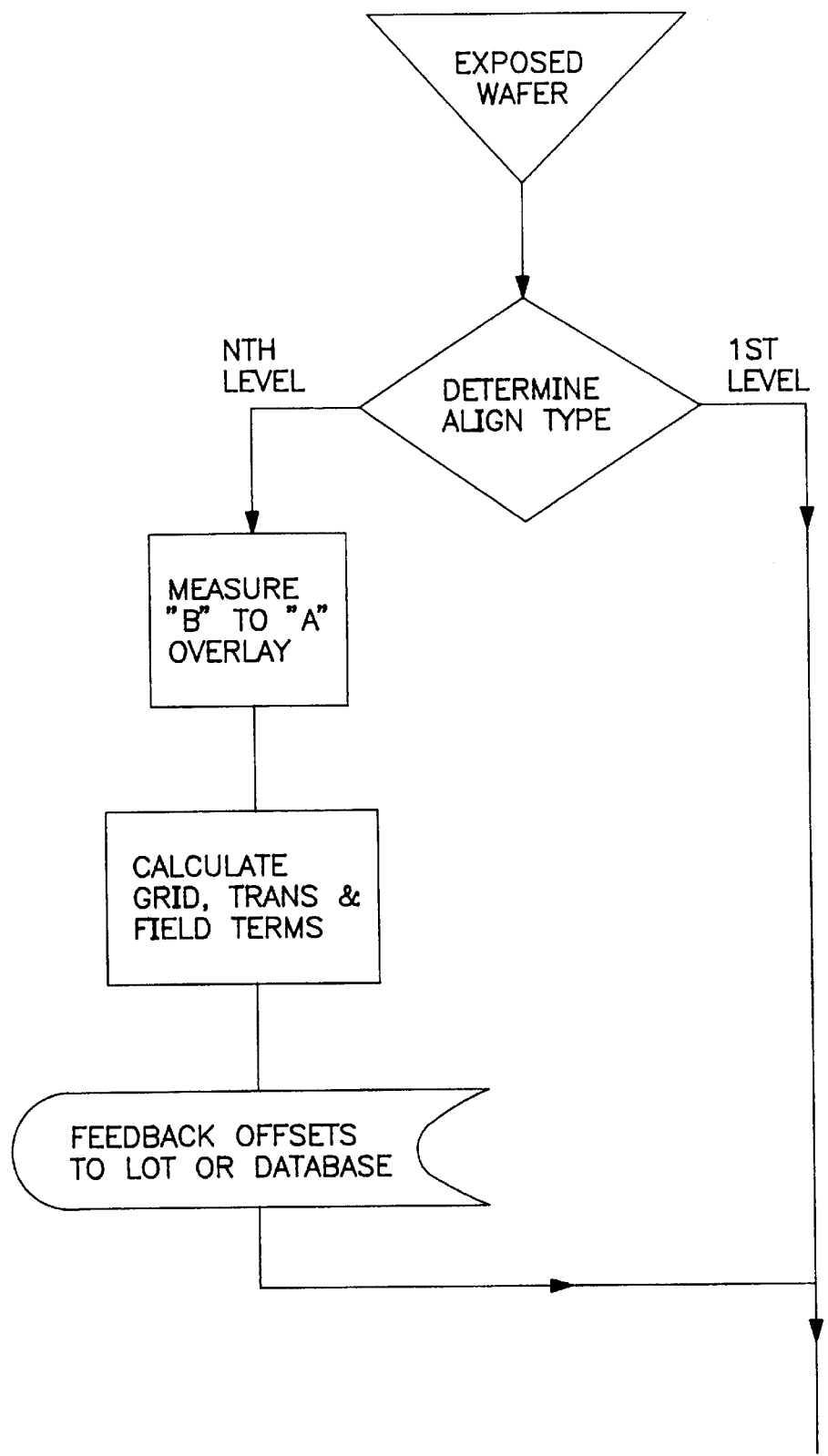
FIG. 7 illustrates a typical process flow diagram used to correct and align an overlay system at the $N^{th}$ level, where two different photo tools are used.
Figure 8:
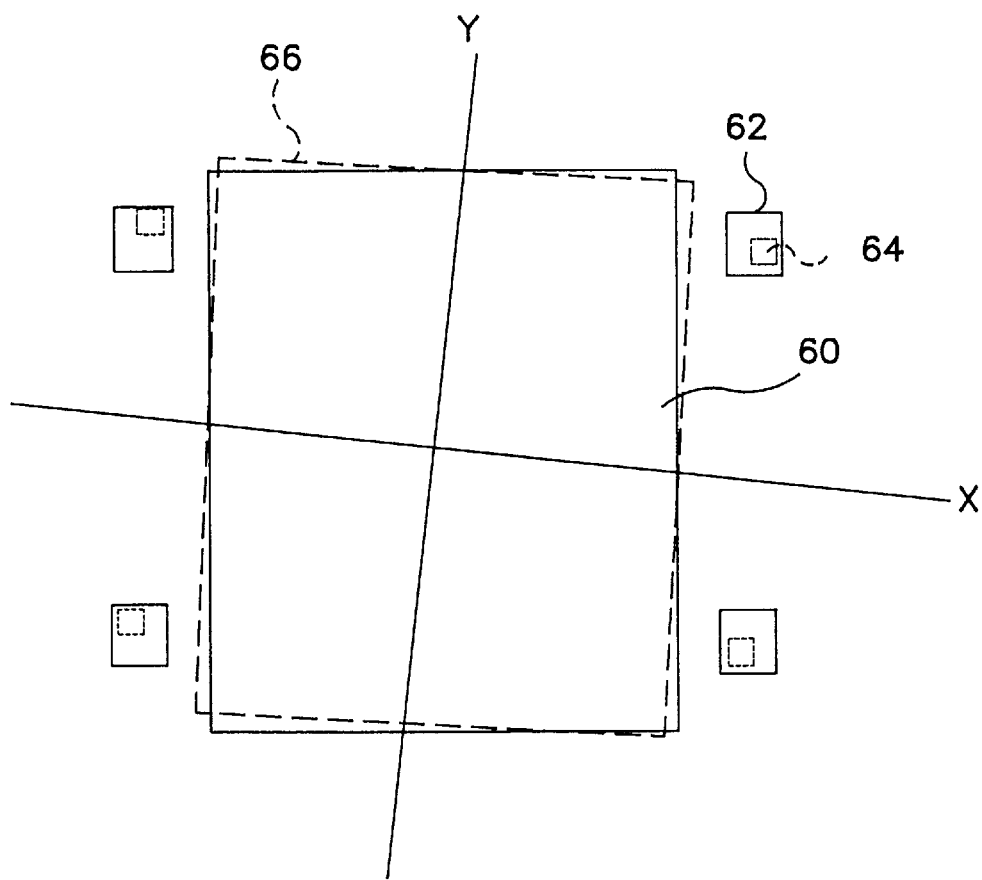
FIG. 8 shows an example of "B" to "A" level alignment errors for fields of the same size.

FIG. 8 illustrates the problem of random walk between levels when the fields are of equal size. The "A" level 66 already has field rotation relative to the X and Y directions. When the "B" level 60 aligns to "A" level 66, "B" level 60 is rotated slightly relative to "A" level 66. "B" to "A" level alignment must be within a certain tolerance. The conventional methodology allows measurement of the relative error between "B" and "A," but not the absolute error.

Figure 9:
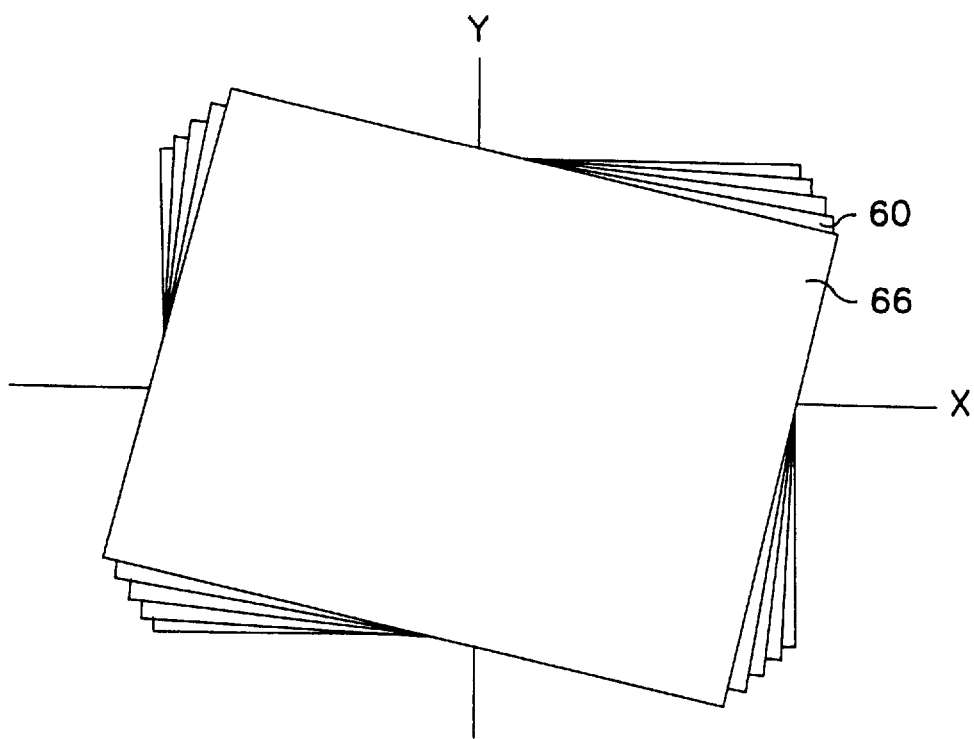
FIG. 9 shows an example of "N" level accrued field term overlay errors for fields of the same size.

Over multiple levels, the total "absolute" rotation (and other) field alignment errors can add up to large values-they can accumulate-even if the level-to-level alignment control is within tolerance. To illustrate, over "N" levels, if Q is the 3σ (three sigma) field term error from any given level to the prior level, then the 3σ accrued field term error would be $(Q)N^{1/2}$. This analysis assumes that the variation of the error term is a normal distribution. FIG. 9 shows a possible, extreme field rotation error which might accrue after N=5 levels for fields of the same size. The analysis is representative of all levels exposed on steppers, independent of their ability to compensate for these errors.

The accrued errors can become non-correctable, using conventional methods, when different exposure field sizes are mixed at different levels. The present invention solves this problem. The present invention also works, of course, should the field sizes be the same from level to level.

Figure 10A:
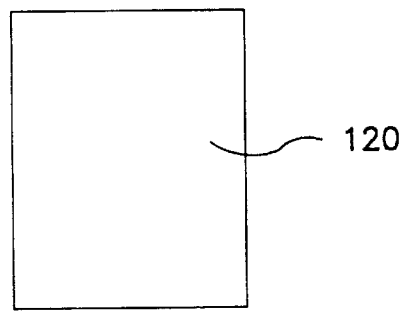
FIGS. 10a, 10b, and 10c show an example of overlay errors due to mismatched field sizes, three chips to one chip.
Figure 10B:
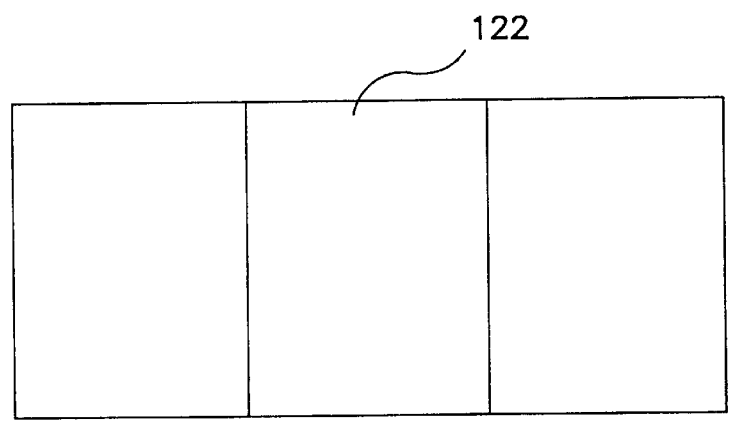
Figure 10C:
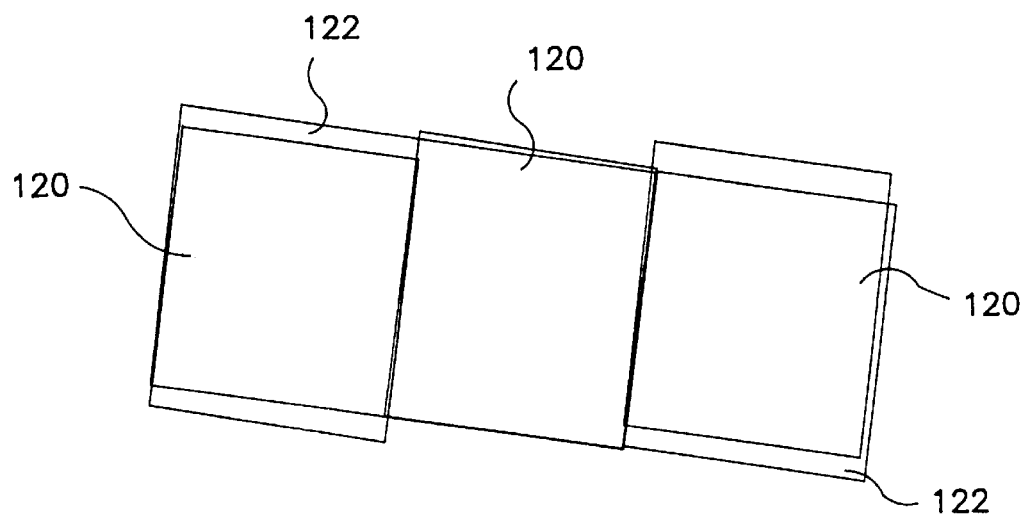

FIGS. 10a, 10b, and 10c illustrate one example of overlay errors that can occur when the field sizes are mismatched. FIG. 10a shows a smaller field "B" level (e.g., mid-ultra violet or MUV stepper) 120. There is one chip per reticle and one chip is exposed per field. FIG. 10b shows a larger field "A" level (e.g., a deep-ultra violet or DUV scanner) 122. There are three chips per reticle and three chips are exposed per field. The MUV system of FIG. 10a has one third of the maximum field size of the DUV system of FIG. 10b. The DUV system of FIG. 10b exposes three chips at one pass and the MUV system of FIG. 10a exposes only one chip at a time.

FIG. 10c shows the case where the "A" level which was put down by the DUV system has a field rotation. Given the degrees of freedom typically available for these systems, the MUV system cannot fully correct for that rotation using the conventional methods without introducing other errors. As illustrated in FIG. 10c, Y translation errors are introduced on the right and left fields. The present invention minimizes the Y translation error on the end chip regions that is introduced when the "B" level is put down.

Figure 11A:
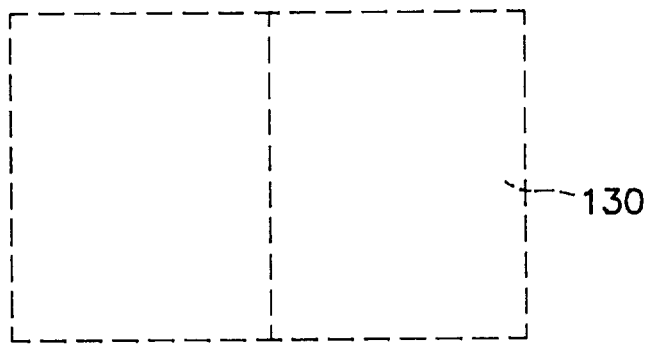
FIGS. 11a, 11b, 11c, and 11d show an example of overlay errors due to mismatched field sizes, three chips to two chips.
Figure 11B:
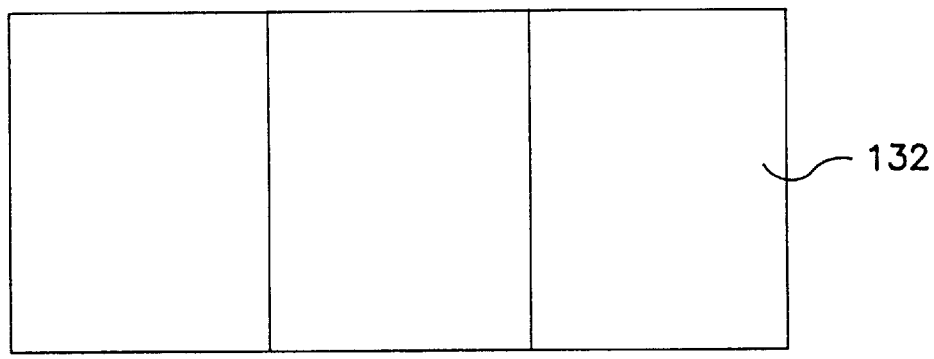
Figure 11C:
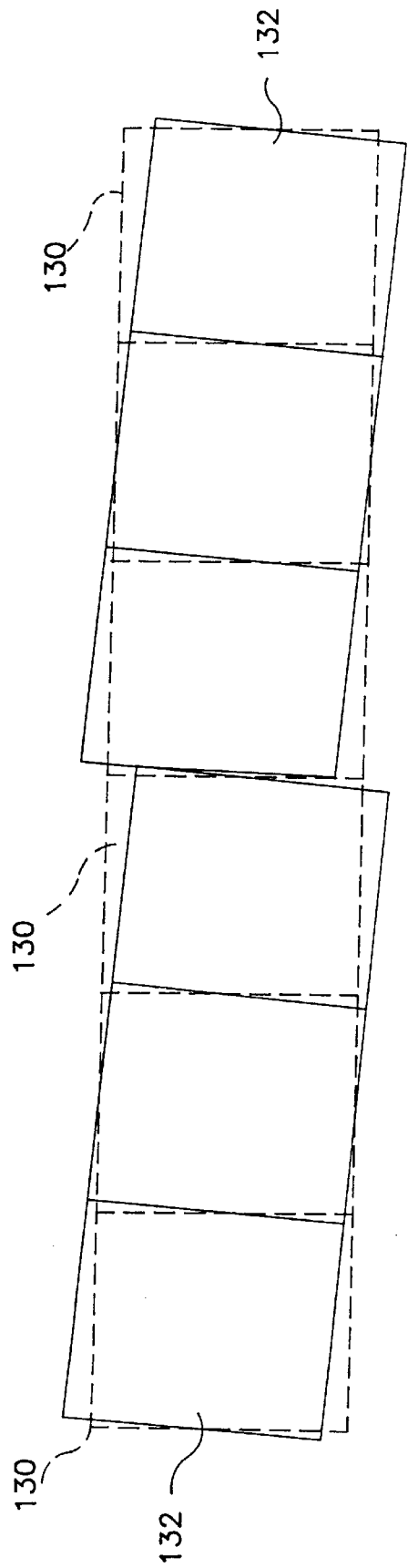
Figure 11D:
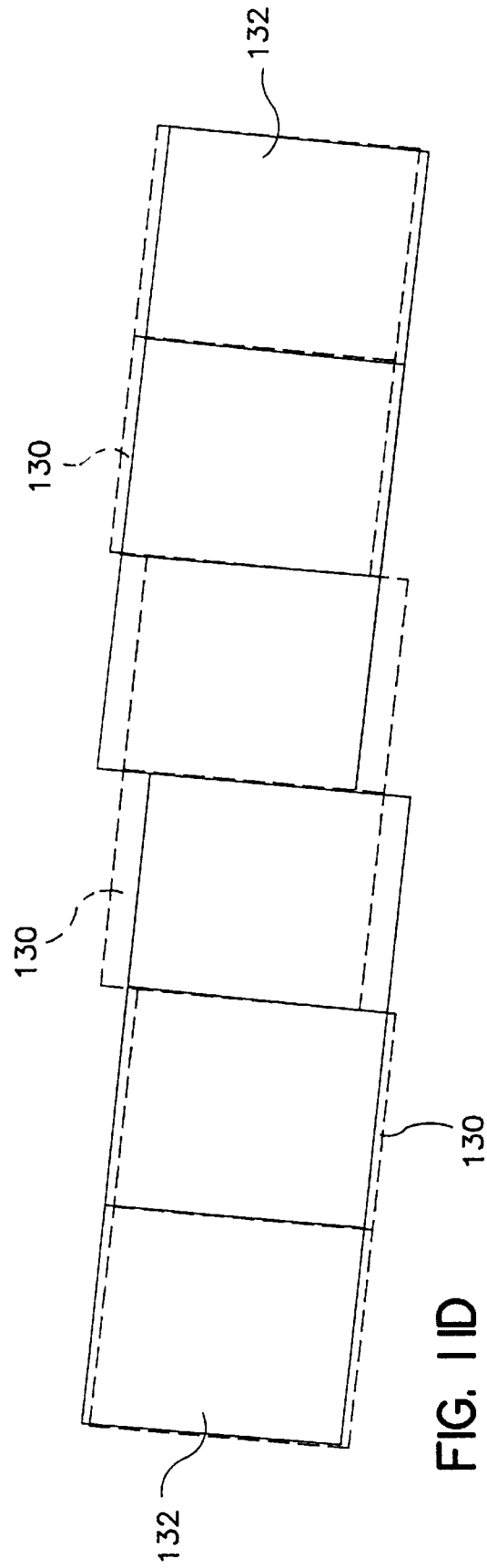

Another example of overlay control error is shown in FIGS. 11a, 11b, 11c, and 11d. FIG. 11a shows a smaller field "B" level 130. There are two chips per reticle and two chips are exposed per field. FIG. 11b shows a larger field "A" level 132. There are three chips per reticle and three chips are exposed per field. FIG. 11c shows smaller "B" level 130 over larger field "A" level 132 without any attempt to correct for the rotation of "A" level 132. FIG. 11d shows the result when correction is attempted. Correction by rotating smaller field "B" level 130, using an equal angle of field rotation, introduces other errors. Specifically, Y translation errors are maximized for the two chips in the overlap area where the two larger "A" level fields come together and straddle the central smaller "B" level field.

This error cannot be corrected using conventional methods. Consequently, the conventional approach would be to either use one chip on the small field system or two chips on each system. This limitation reduces productivity. The present invention minimizes the overlay errors, especially when different field sizes are used, and thereby increases productivity.

Figure 12:
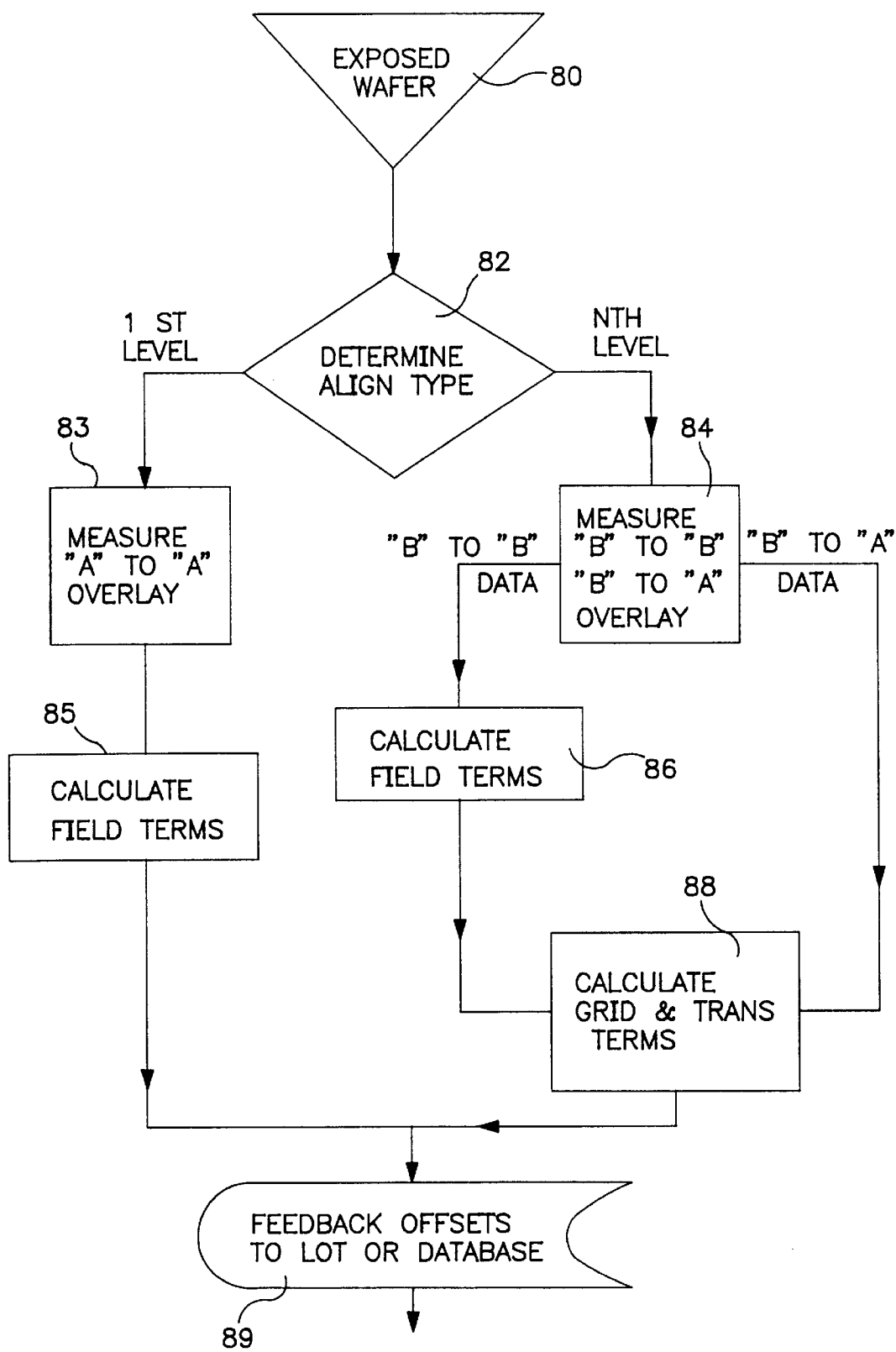
FIG. 12 is a high-level flow diagram of an exemplary embodiment of the present invention.

FIG. 12 shows an overview of the method for optimization of stepper overlay error correction using an "A" level field stepper, a "B" level field stepper, metrology equipment, and a processor according to the present invention. As shown in FIG. 12, in the first step 80 of the method, a wafer is exposed. Then, in decision step 82, if the exposure is the first level then metrology equipment and overlay targets are used to measure the within-level ("A" to "A") between-field overlay errors as shown in step 83. In step 85, the field term alignment errors are calculated from the within-level between-field overlay measurements.

Returning to decision step 82, if the exposure is not the first level then optical equipment and overlay targets are used to measure the level-to-level ("B" to "A") field and within-level ("B" to "B") between-field overlay errors as shown in step 84. In step 86, the field term alignment errors are calculated from the within-level between-field overlay measurements. In step 88, the correction factors are calculated from the field term alignment errors and the level-to-level overlay measurements. Finally, in step 89, the field layers are aligned based on the correction factors.

Continuing with FIG. 12, in step 80, an "A" level field layer is patterned on a substrate using the "A" level field stepper, then a "B" level field layer is patterned overlying the "A" level field layer using the "B" level field stepper. In the exemplary embodiment of the present invention, the patterning of the "A" level field layer is at least the $N^{th}$ level patterned on the substrate and the accrued field term error is controlled to within a certain tolerance. The present invention provides a universal overlay control scheme that supports cross boundary stepping, where the number of fields put down on level "A" is not equal to, nor is it a common multiple of, the number of fields put down on level "B" and vice versa.

Figure 13:
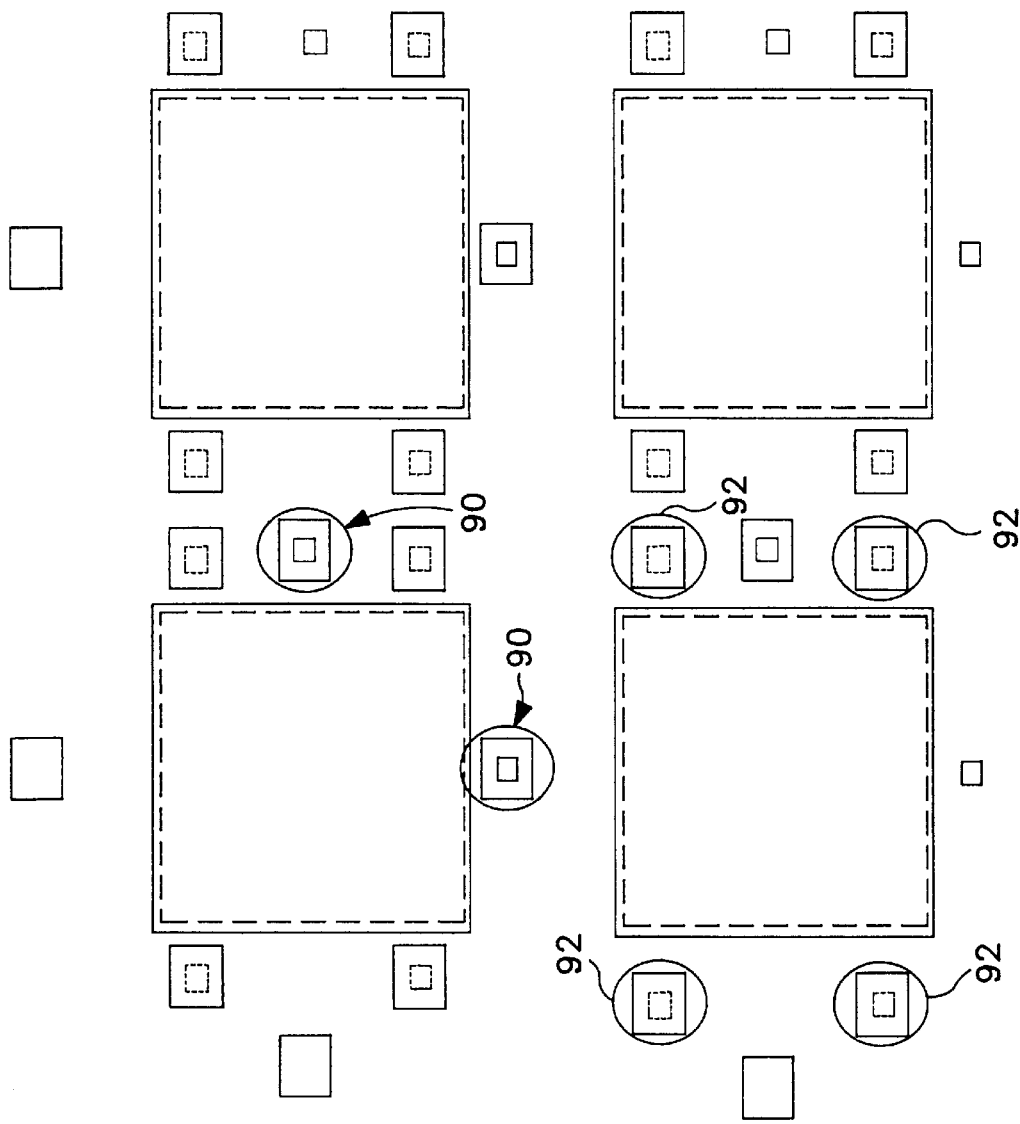
FIG. 13 shows an example of the combined measurements, taken from box-in-box structures, used in the error calculations of the present invention.

The within-level between-field systematic alignment errors are comprised of local field rotation, field skew, field translation, and field magnification errors. The level-to-level systematic alignment errors are comprised of grid term and translation alignment errors. The grid term errors are comprised of grid magnification, grid rotation, and grid skew errors. FIG. 13 shows the measurement of "B" to "B" box-in-box structures 90 for field term error calculations. FIG. 13 also shows the measurement of "B" to "A" box-in-box structures 92 for X,Y translation and grid error calculations. In FIG. 13, the dashed lines represent the "A" level and the solid lines represent the "B" level.

Correction terms for between-field "A" to "A" level errors are calculated using the following general error equations (for an arbitrary point "i" in the center of an interlocking box-in-box structure):

$$Xerr_i = -frot\ DY + fxmag\ DX + XXres_i$$

$$Yerr_i = (frot + fskew)\ DX + fymag\ DY + YYres_i$$

where $Xerr_i$ and $Yerr_i$ are the measured X and Y overlay errors, respectively, at an arbitrary point "i"; frot, fxmag, fskew, and fymag are average field systematic error terms; DX and DY are the X and Y field center-to-center spacings, respectively, between adjacent fields to which the "$i^{th}$" point is referenced; and $XXres_i$ and $YYres_i$ are non-systematic residual errors.

These equations rely on several assumptions. First, the rotation and skew angles are small and $\tan(\theta)$ is approximately $\theta$ in units of $\mu$rad (an appropriate conversion factor must be applied for units other than $\mu$rad). This is a good approximation for typical semiconductor overlay. Second, frot is assumed to reference rotation of vertical images. Third, the quantity (frot+fskew) is assumed to reference rotation of horizontal images.

Finally, grid terms are assumed to be identically zero. "A" to "A" box-in-box metrology analysis cannot uniquely separate or identify Y stepping magnification, X stepping magnification, wafer global (or grid) rotation, and wafer global (or grid) skew from field Y magnification, field X magnification, field rotation, and field skew. For example, a −1 ppm field Y magnification error would create the same interlocking box-in-box overlay measurements as a +1 ppm wafer global Y magnification error.

Where there are errors between levels ("B" to "A"), the grid, translation, and field terms are incorporated. The correction terms are calculated using the following general overlay error equations (for an arbitrary point "i"):

$$Xerr_i = XT - (frot + GROT)\ ly_i + fxmag\ lx_i - GROT\ LY_i + GXMAG\ LX_i + Xres_i$$

$$Yerr_i = YT + (frot + fskew + GROT)lx_i + fymag\ ly_i + (GROT + GSKEW)LX_i + GYMAG\ LY_i + Yres_i$$

where $Xerr_i$ and $Yerr_i$ are the measured X and Y overlay errors, respectively, at an arbitrary point "i"; XT is X wafer translation; YT is Y wafer translation; frot is average field rotation; fxmag is average field X magnification; fskew is average field skew; fymag is average field Y magnification; GXMAG is wafer global X stepping magnification; GYMAG is wafer global Y stepping magnification; GROT is wafer global rotation; GSKEW is wafer global skew; $lx_i$ and $ly_i$ are field Cartesian coordinates of the "$i^{th}$" point (0,0 assumed to be at the field center of rotation and magnification); $LX_i$ and $LY_i$ are Cartesian coordinates of the field center of the field which the "$i^{th}$" point references (0,0 is assumed to be at the wafer center of rotation and magnification); and $Xres_i$ and $Yres_i$ are nonsystematic residual errors in X and Y, respectively.

These equations also rely on several assumptions. First, the rotation and skew angles are assumed to be small (as above). Second, frot and GROT are assumed to reference rotation of vertical images. Finally, the quantities (frot+fskew) and (GROT+GSKEW) are assumed to reference rotation of horizontal images.

The invention uses the following equations to calculate the "B" to "B" between-field errors:

$$(Xerr_i)_{BB} = -frot_{BB}DY + fxmag_{BB}DX + XXres_i$$

$$(Yerr_i)_{BB} = (frot_{BB} + fskew_{BB})\ DX + fymag_{BB}DY + YYres_i$$

"B" to "B" metrology is used to measure $(Xerr_i)_{BB}$ and $(Yerr_i)_{BB}$ directly and the equations are solved to obtain values for $frot_{BB}$, $fskew_{BB}$, $fxmag_{BB}$, and $fymag_{BB}$. The results are then used to calculate the "B" to "A" level-to-level overlay errors, using the following equations:

$$(Xerr_i)_{BA} = XT_{BB} - (frot_{BB} + GROT_{BA})\ ly_i + fxmag_{BB}lx_i - GROT_{BA}LY_i + GXMAG_{BA}LX_i + Xres_i$$

$$(Yerr_i)_{BA} = YT_{BB} + (frot_{BB} + fskew_{BB} + GROT_{BA})lx_i + fymag_{BB}ly_i + (GROT_{BA} + GSKEW_{BA})LX_i + GYMAG_{BA}LY_i + Yres_i$$

"B" to "A" metrology is used to measure $(Xerr_i)_{BA}$ and $(Yerr_i)_{BA}$ directly and the equations are solved to obtain values for $GXMAG_{BA}$, $GYMAG_{BA}$, $GROT_{BA}$, $GSKEW_{BA}$, $XT_{BA}$, and $YT_{BA}$. The equations are solved using any technique such as "least squares" best fit or any other mathematical technique for solving for the unknown variables based on minimization of the residual errors. The calculated terms are fed back to the lithography tool to correct overlay errors or to a database to establish historical and predicted future offsets, or for any other use for which optimized offsets are generally used in semiconductor lithography.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for optimization of overlay error correction using a first exposure tool, a second exposure tool, metrology equipment, and a processor comprising the steps of:

a) patterning a first level field layer on a substrate using the first exposure tool;

b) patterning a second level field layer overlying the first level field layer using the second exposure tool;

c) measuring level-to-level and within-level between-field errors using overlay targets and metrology equipment;

d) calculating field term alignment errors from the within-level between-field overlay measurement using the processor;

e) calculating correction factors from the field term alignment errors and the level-to-level overlay measurements using the processor; and f) aligning the second level to the first level based on the correction factors.

2. The method as recited in claim 1 wherein the patterning of the first level field layer is at least the $N^{th}$ level patterned on the substrate, the method preventing accumulated alignment errors from exceeding a certain manufacturing tolerance.

3. The method as recited in claim 1 wherein:

N is the number of items per field put down on the first level;

M is the number of items per field put down on the second level;

N is neither equal to now a common multiple of M and vice versa.

4. The method as recited in claim 1 wherein the field term alignment error comprises local field rotation, field skew, field translation, and field magnification errors.

5. The method as recited in claim 1 wherein the level-to-level errors colmprise field term, grid term, and translation alignment errors.

6. The method as recited in claim 5 wherein the grid term errors comprise grid magnification, grid rotation, and grid skew errors.

7. The method as recited in claim 1 wherein the first exposure tool is an "A" level field stepper, the second exposure tool is a "B" level field stepper, the first level field layer is an "A" level field layer, the second level field layer is a "B" level field layer, and the method optimizes stepper overlay error correction.

8. The method as recited in claim 7 wherein the patterning of the "A" level field layer is at least the $N^{th}$ level patterned on the substrate, the method preventing accumulated alignment errors from exceeding a certain manufacturing tolerance.

9. The method as recited in claim 7 wherein:

N is the number of chips per field put down on level A;

M is the number of chips per field put down on level B;

N is neither equal to now a common multiple of M and vice versa.

10. The method as recited in claim 7 wherein the field term alignment error comprises local field rotation, field skew, field translation, and field magnification errors.

11. The method as recited in claim 7 wherein the level-to-level errors comprise field term, grid term, and translation alignment errors.

12. The method as recited in claim 11 wherein the grid term errors comprise grid magnification, grid rotation, and grid skew errors.

13. A method for optimization of silicon wafer stepper overlay error correction using a first field stepper, a second field stepper, metrology equipment, and a processor comprising the steps of:

a) patterning an "A" level field layer on a substrate using the first field stepper;

b) pattering a "B" level field layer overlying said "A" level field layer using the "A" level field stepper;

c) measuring level-to-level field and within-level between-field errors using overlay targets and metrology equipment;

d) calculating field term alignment errors from the within-level butted field overlay measurement using the processor, where the field term alignment error is comprised of the local field rotation, field skew, field translation, and field magnification errors;

e) calculating correction factors from the field term alignment errors and the level-to-level overlay measurements using the processor; and f) aligning the field layers based on the correction factors.

14. The method as recited in claim 13 wherein the level-to-level errors comprise field term, grid term, and translation alignment errors.

15. The method as recited in claim 14 wherein the grid term errors comprise grid magnification, grid rotation, and grid skew errors.

* * * * *

UNITED STATES PATENT AND TRADEMARK OFFICE
CERTIFICATE OF CORRECTION

PATENT NO. : 5,877,861
DATED : March 2, 1999
INVENTOR(S) : Christopher P. Ausschnitt and Timothy J. Wilstshire It is certified that error appears in the above-identified patent and that said Letters Patent is hereby corrected as shown below:

In column 7, line 22, delete the word "colmprise" and insert the word "compromise" as written on page 16, claim 5, line 2 of the application as filed.

In column 8, line 1, delete the word "now" and insert the word "nor" as written on page 17, claim 9, line 6 of the application as filed.

In column 8, line 18, delete the word "pattering" and insert the word "patterning" as written on page 17, claim 13, line 7 of the application as filed.

In column 8, line 19, delete the second "A" of the limitation b) and insert "B" as written on page 17, claim 13, line 8 of the application as filed.

Signed and Sealed this

Third Day of August, 1999

*Attest:*

Q. TODD DICKINSON

*Attesting Officer*     *Acting Commissioner of Patents and Trademarks*

UNITED STATES PATENT AND TRADEMARK OFFICE
CERTIFICATE OF CORRECTION

PATENT NO. : 5,877,861
DATED : March 2, 1999
INVENTOR(S) : Christopher P. Ausschnitt and Timothy J. Wilstshire It is certified that error appears in the above-indentified patent and that said Letters Patent is hereby corrected as shown below:

In column 7, line 22, delete the word "colmprise" and insert the word "compromise"

In column 8, line 1, delete the word "now" and insert the word "nor"

In column 8, line 18, delete the word "pattering" and insert the word "patterning"

In column 8, line 19, delete the second "A" of the limitation b) and insert "B"

This Certificate supersedes Certificate of Correction issued August 3, 1999.

Signed and Sealed this

Twenty-third Day of November, 1999

Attest:

Q. TODD DICKINSON

Attesting Officer

Acting Commissioner of Patents and Trademarks